(12) United States Patent
Shigenobu et al.

(10) Patent No.: US 8,564,758 B2
(45) Date of Patent: Oct. 22, 2013

(54) EXPOSURE APPARATUS AND METHOD OF DECREASING FLUCTUATIONS IN OPTICAL CHARACTERISTICS OF PROJECTION SYSTEM

(75) Inventors: Atsushi Shigenobu, Utsunomiya (JP); Yasuo Hasegawa, Utsunomiya (JP); Takashi Sukegawa, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 514 days.

(21) Appl. No.: 12/397,625

(22) Filed: Mar. 4, 2009

(65) Prior Publication Data
US 2009/0225293 A1    Sep. 10, 2009

(30) Foreign Application Priority Data
Mar. 10, 2008    (JP) ................. 2008-060075

(51) Int. Cl.
G03B 27/68    (2006.01)
G03B 27/32    (2006.01)

(52) U.S. Cl.
USPC .............................................. 355/52; 355/77

(58) Field of Classification Search
None
See application file for complete search history.

(56) References Cited

U.S. PATENT DOCUMENTS

| 5,925,887 A | 7/1999 | Sakai |
| 6,163,365 A | 12/2000 | Takahashi |
| 6,457,832 B1 * | 10/2002 | Okuyama ...................... 353/38 |

FOREIGN PATENT DOCUMENTS

| JP | 08-069963 A | 3/1996 |
| JP | 2007-294699 A | 11/2007 |

* cited by examiner

Primary Examiner — Peter B Kim
Assistant Examiner — Michelle Iacoletti
(74) Attorney, Agent, or Firm — Canon USA Inc IP Division

(57) ABSTRACT

The present invention provides an exposure apparatus including a map obtaining unit configured to obtain a pupil aberration map representing saturation values of fluctuations in each of optical characteristics generated in a plurality of regions, which are obtained by dividing a pupil plane of a projection optical system, upon irradiating the plurality of regions with a unit amount of light, a distribution obtaining unit configured to obtain a light intensity distribution formed on the pupil plane of the projection optical system upon illuminating a pattern of an arbitrary reticle in an arbitrary illumination mode, and a calculation unit configured to calculate a saturation value of a fluctuation in each of the optical characteristics generated in the projection optical system upon illuminating the pattern of the arbitrary reticle in the arbitrary illumination mode, based on the obtained pupil aberration map and the obtained light intensity distribution.

12 Claims, 6 Drawing Sheets

FIG. 2
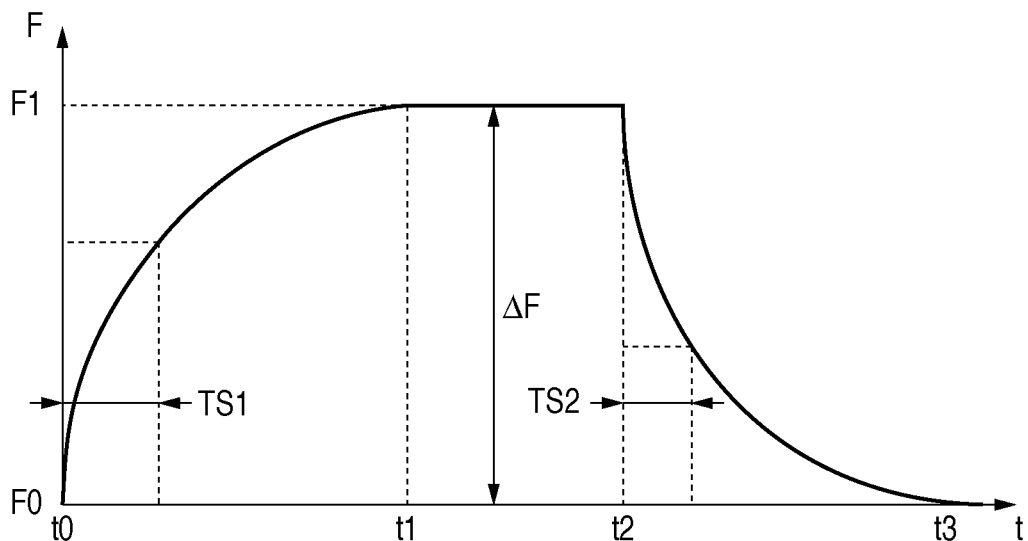
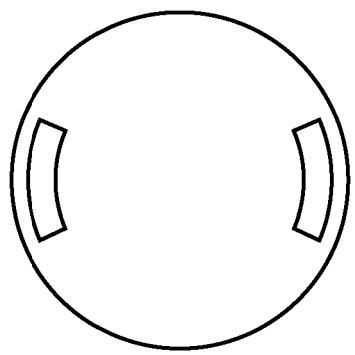
FIG. 3A
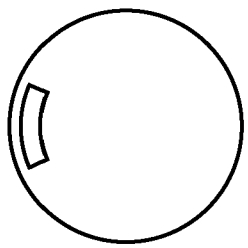
FIG. 3B
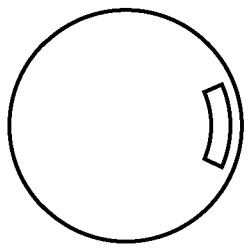
FIG. 3C

F I G. 5
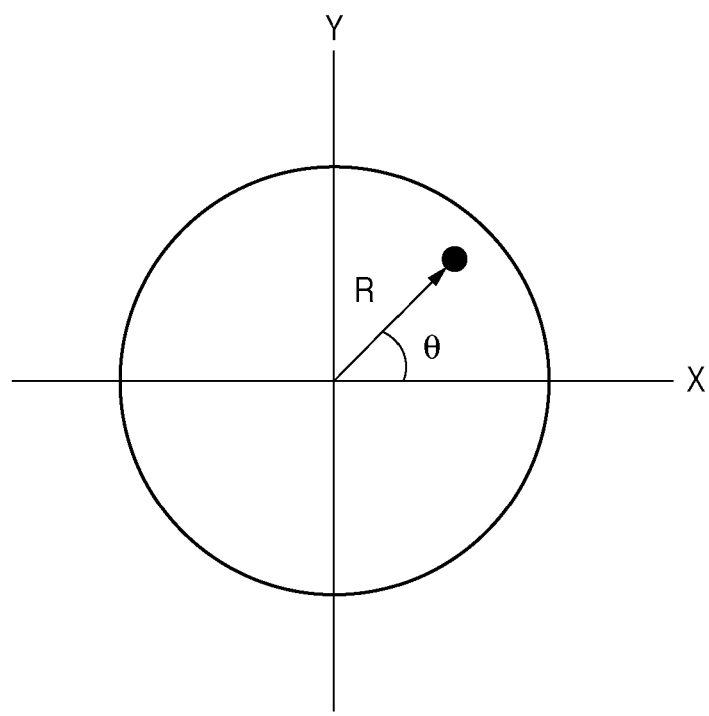

|   | RADIUS OF POLE | CENTRAL POSITION ||
|---|---|---|---|
|   |   | X | Y |
| 1 | 0.1 | 0 | 0 |
| 2 | 0.1 | 0 | 0.6 |
| 3 | 0.1 | 0 | 0.8 |
| 4 | 0.1 | 0.6 | 0 |
| 5 | 0.1 | 0.8 | 0 |

EXPOSURE APPARATUS AND METHOD OF DECREASING FLUCTUATIONS IN OPTICAL CHARACTERISTICS OF PROJECTION SYSTEM

BACKGROUND OF THE INVENTION

1. Field of the Invention

The present invention relates to an exposure apparatus, an exposure method, a calculation method, and a device fabrication method.

2. Description of the Related Art

A projection exposure apparatus has conventionally been employed to fabricate a micropatterned semiconductor device such as a semiconductor memory or logic circuit by using photolithography. The projection exposure apparatus projects and transfers a circuit pattern formed on a reticle (mask) onto a substrate such as a wafer by a projection optical system.

When the projection exposure apparatus repeats exposure, the projection optical system heats up upon absorbing the energy of the exposure light and then cools down upon dissipating the heat, so fluctuations (to be referred to as "exposure aberrations" hereinafter) in the optical characteristics (e.g., projection magnification and wavefront aberration) of the projection optical system occur. The exposure aberration can be calculated by a computational expression which uses, as parameters, a time constant unique to the projection optical system, an exposure aberration saturation value (exposure aberration correction coefficient) per unit light amount when the projection optical system has reached a thermal equilibrium, the sum total of light which passes through the reticle, and the exposure time. The exposure aberration is corrected by driving a lens which constitutes the projection optical system or controlling the pressure between lenses. Details of these techniques are disclosed in Japanese Patent Laid-Open No. 8-069963.

The exposure aberration correction coefficient changes for each illumination condition, so it must be calculated for each illumination condition. However, calculation of the exposure aberration correction coefficients for all illumination conditions used in the exposure apparatus requires a very large amount of time. For this reason, in practice, exposure aberration correction coefficients are predicted from those for several other illumination conditions. For example, the exposure aberration correction coefficients for several illumination conditions are calculated for each illumination mode, including a normal illumination mode, an annular illumination mode, and a dipole illumination mode. The exposure aberration correction coefficients for illumination conditions, for which calculation is not performed, in the same mode are predicted by interpolating or extrapolating those for the illumination conditions for which their calculation is performed actually.

Unfortunately, in the prior art, illumination modes for which the exposure aberration correction coefficients can be predicted are limited to specific illumination modes, so the exposure aberration correction coefficients must be individually calculated for other illumination modes. This increases the load of calculation of the exposure aberration correction coefficients in proportion to the number of illumination modes used in the exposure apparatus.

In addition, although a light intensity distribution formed on the pupil plane of the projection optical system changes even in the same illumination mode due to the influence of diffracted light from the reticle, the prior art does not take account of the diffracted light from the reticle. This makes it impossible to precisely predict the exposure aberration correction coefficients. It is therefore impossible to precisely correct exposure aberrations generated in the projection optical system, resulting in a decrease in the exposure performances (e.g., the imaging performance) of the exposure apparatus.

SUMMARY OF THE INVENTION

The present invention provides an exposure apparatus which can attain excellent exposure performance by precisely calculating and correcting the amounts of fluctuations in the optical characteristics generated in a projection optical system.

According to one aspect of the present invention, there is provided an exposure apparatus comprising a projection optical system configure to project a pattern of a reticle onto a substrate, a map obtaining unit configured to obtain a pupil aberration map representing saturation values of fluctuations in each of optical characteristics generated in a plurality of regions, which are obtained by dividing a pupil plane of the projection optical system, upon irradiating the plurality of regions with a unit amount of light, a distribution obtaining unit configured to obtain a light intensity distribution formed on the pupil plane of the projection optical system upon illuminating a pattern of an arbitrary reticle in an arbitrary illumination mode, a calculation unit configured to calculate a saturation value of a fluctuation in each of the optical characteristics generated in the projection optical system upon illuminating the pattern of the arbitrary reticle in the arbitrary illumination mode, based on the pupil aberration map obtained by the map obtaining unit and the light intensity distribution obtained by the distribution obtaining unit, and an adjusting unit configured to adjust the projection optical system so as to decrease an amount of the fluctuation in each of the optical characteristics of the projection optical system, which is calculated from the saturation value of the fluctuation in each of the optical characteristics generated in the projection optical system, which is calculated by the calculation unit.

Further aspects and features of the present invention will become apparent from the following description of exemplary embodiments with reference to the attached drawings.

BRIEF DESCRIPTION OF THE DRAWINGS

FIG. 2 is a graph showing an example of a fluctuation (a temporal change) in the focus of a projection optical system of the exposure apparatus shown in FIG. 1.

FIGS. 3A to 3C are views for explaining the additivity of exposure aberrations generated in the projection optical system of the exposure apparatus shown in FIG. 1.

FIG. 5 is a graph for explaining a pupil aberration map.

DESCRIPTION OF THE EMBODIMENTS

Figure 1:
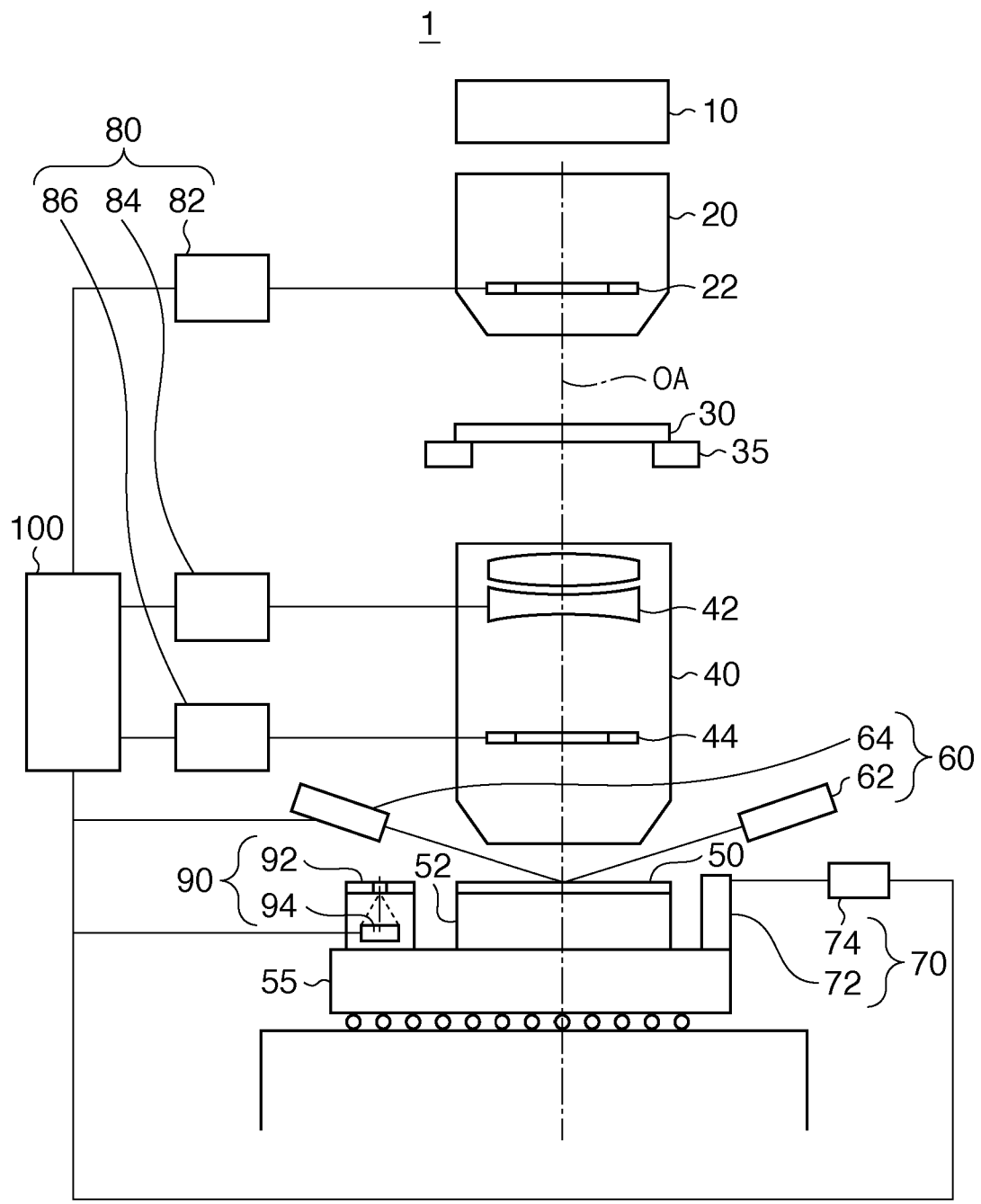
FIG. 1 is a schematic view showing an exposure apparatus according to one aspect of the present invention.

Preferred embodiments of the present invention will be described below with reference to the accompanying drawings. The same reference numerals denote the same members throughout the drawings, and a repetitive description thereof will not be given.

FIG. 1 is a schematic view showing an exposure apparatus 1 according to one aspect of the present invention. In this embodiment, the exposure apparatus 1 is a projection exposure apparatus which transfers the pattern of a reticle onto a wafer by the step & scan scheme. However, the exposure apparatus 1 can adopt the step & repeat scheme or another exposure scheme.

The exposure apparatus 1 includes a light source 10, an illumination optical system 20, a reticle stage 35 which mounts a reticle 30, a projection optical system 40, and a wafer stage 55 which mounts a wafer 50. The exposure apparatus 1 also includes a focus detection system 60, stage position detection system 70, drive mechanism 80, detection unit 90, and control unit 100.

The light source 10 is, for example, an excimer laser such as an ArF excimer laser having a wavelength of about 193 nm or a KrF excimer laser having a wavelength of about 248 nm, an $F_2$ laser having a wavelength of about 157 nm, or a lamp such as a mercury lamp or xenon lamp.

The illumination optical system 20 illuminates the reticle 30 with light from the light source 10. The illumination optical system 20 includes a stop 22 having a variable aperture size and shape.

The reticle 30 has a pattern (circuit pattern) to be transferred onto the wafer 50, and is supported and driven by the reticle stage 35. Since the exposure apparatus 1 is of the step & scan scheme, it transfers the pattern of the reticle 30 onto the wafer 50 by scanning them.

The reticle stage 35 supports the reticle 30 and drives it three-dimensionally (in the direction of an optical axis OA of the projection optical system 40 and in a plane perpendicular to the optical axis OA) using, for example, a linear motor.

The projection optical system 40 projects the pattern of the reticle 30 onto the wafer 50. The projection optical system 40 includes a lens 42 which can be driven in the direction of the optical axis OA, and a stop 44 having a variable aperture size. The lens 42 defines the projection magnification of the projection optical system 40 in accordance with the position in the direction of the optical axis OA. The stop 44 is arranged at a position optically conjugate to that of the stop 22 of the illumination optical system 20.

The wafer 50 is a substrate onto which the pattern of the reticle 30 is projected (transferred). However, the wafer 50 can be substituted by a glass plate or another substrate.

The wafer stage 55 supports the wafer 50 through a wafer chuck 52, and drives the wafer 50 in cooperation with the wafer chuck 52. The wafer chuck 52 drives the wafer 50 in, for example, the direction of the optical axis OA. The wafer stage 55 drives the wafer 50 two-dimensionally in a plane perpendicular to the optical axis OA.

The focus detection system 60 has a function of detecting the position of the wafer 50 in the direction of the optical axis OA (i.e., the surface level of the wafer 50). The focus detection system 60 includes an irradiation unit 62 which irradiates the surface of the wafer 50 with light, and a light-receiving unit 64 which receives the light reflected by the surface of the wafer 50 and outputs a signal according to the surface level of the wafer 50.

The stage position detection system 70 includes a reflecting mirror 72 fixed on the wafer stage 55, and a laser interferometer 74 which detects the position of the wafer stage 55 by irradiating the reflecting mirror 72 with laser light.

The drive mechanism 80 includes a first drive unit 82, second drive unit 84, and third drive unit 86. The first drive unit 82 changes the aperture size and shape of the stop 22 (i.e., the numerical aperture (NA) of the illumination optical system 20) by driving a light-shielding plate which constitutes the stop 22 of the illumination optical system 20. The second drive unit 84 changes the position of the lens 42 (i.e., the projection magnification of the projection optical system 40) by driving the lens 42 of the projection optical system 40 in the direction of the optical axis OA. The third drive unit 86 changes the aperture size of the stop 44 (i.e., the numerical aperture (NA) of the projection optical system 40) by driving a light shielding plate which constitutes the stop 44 of the projection optical system 40.

The detection unit 90 has a function of detecting a light intensity distribution formed near the reticle 30 and that formed on the pupil plane of the projection optical system 40. The detection unit 90 is supported by the wafer stage 55 and arranged on the side of the image plane of the projection optical system 40. In this embodiment, the detection unit 90 includes a light-shielding plate 92 in which a pinhole which passes the light from the projection optical system 40 is formed, and a photoelectric conversion unit 94 which detects the light from the pinhole. The light-shielding plate 92 is arranged such that the surface of the light-shielding plate 92 is flush with that of the wafer 50 (i.e., it is positioned near the imaging plane of the projection optical system 40). The photoelectric conversion unit 94 includes, for example, a CCD formed by arraying a plurality of photoelectric conversion devices. The photoelectric conversion unit 94 is arranged at a position spaced apart from the light-shielding plate 92 (the imaging plane of the projection optical system 40) by a predetermined distance in order to receive the light having passed through the pinhole in the light-shielding plate 92. The detection unit 90 detects a light intensity distribution formed on the pupil plane of the projection optical system 40 from the output distribution of the photoelectric conversion unit 94, and also detects a light intensity distribution formed near the reticle 30 from the output sum of the photoelectric conversion unit 94. In this manner, the detection unit 90 also has an aspect as a distribution obtaining unit which obtains a light intensity distribution formed on the pupil plane of the projection optical system 40.

The control unit 100 includes a CPU and memory (neither are shown) and controls the operation of the exposure apparatus 1. For example, the control unit 100 controls the position of the wafer chuck 52 based on the output (detection result) from the focus detection system 60 so that the surface of the wafer 50 is aligned with the imaging plane of the projection optical system 40. The control unit 100 also controls driving of the wafer stage 55 based on the output (detection result) from the stage position detection system 70.

A fluctuation in the optical characteristic of the projection optical system 40 upon exposure will be explained herein. In this embodiment, the focus of the projection optical system 40 will be exemplified as the optical characteristic of the projection optical system 40. However, the optical characteristic of the projection optical system 40 is not particularly limited to the focus, and includes, for example, the field curvature, projection magnification, distortion, and wavefront aberration.

FIG. 2 is a graph showing an example of a fluctuation (a temporal change) in the focus of the projection optical system 40. In FIG. 2, the abscissa indicates a time t and the ordinate indicates a focus F of the projection optical system 40. Also, the initial focus (i.e., the focus before exposure) of the projection optical system 40 is indicated by F0.

Referring to FIG. 2, when the exposure starts at time t0, the focus fluctuates over time and stabilizes at a constant focus F1 at time t1. After time t1, the focus stays at F1 even when the exposure light enters the projection optical system 40 because thermal energy absorbed in the projection optical system 40 and that dissipated from the projection optical system 40 have already reached an equilibrium. When the exposure stops at time t2, the focus returns to the initial state over time and reaches the initial focus F0 at time t3.

A focus fluctuation amount ΔF from F0 to F1 changes depending on the pattern size of the reticle 30 (the size of the exposure region), the ratio of the light-transmitting portion (transmittance) of the reticle 30 to its pattern size, and the pulse energy emitted by the light source 10. Therefore, the focus fluctuation amount ΔF changes in proportion to the exposure energy applied to the projection optical system 40, and is given by:

$$\Delta F = K \times Q \quad (1)$$

where Q is the exposure energy, and K is the focus fluctuation saturation value per unit light amount (unit exposure energy), that is, the exposure aberration saturation value (exposure aberration correction coefficient) and is a value (F1 in FIG. 2) which converges a predetermined time after the start of exposure. A time constant TS1 from time t0 to time t1 (at the leading edge) and a time constant TS2 from time t2 to time t3 (at the trailing edge) stay constant irrespective of the exposure energy applied to the projection optical system 40, and are unique to the projection optical system 40. At the leading and trailing edges, the focus of the projection optical system 40 exhibits fluctuations similar to exponential characteristics. The focus characteristic at the leading edge is approximated by:

$$\Delta F \times (1 - \exp(-t/TS1)) \quad (2)$$

The focus characteristic at the trailing edge is approximated by:

$$\Delta F \times \exp(-t/TS2) \quad (3)$$

Note that a light intensity distribution formed on the pupil plane of the projection optical system 40 (i.e., the exposure energy applied to the projection optical system 40) changes upon changing the illumination mode, illumination condition, or reticle (pattern), so the exposure aberration correction coefficient, in turn, changes. This makes it necessary to model a fluctuation in the optical characteristic of the projection optical system 40 by the functions given by expressions (1) to (3), and to precisely calculate the exposure aberration correction coefficient serving as a coefficient which quantizes the amount of fluctuation in the optical characteristic of the projection optical system 40 in accordance with the illumination mode, illumination condition, and reticle (pattern).

To achieve this operation, in this embodiment, the exposure aberration correction coefficient is calculated based on a light intensity distribution formed on the pupil plane of the projection optical system 40 upon illuminating the pattern of an arbitrary reticle in an arbitrary illumination mode, and a pupil aberration map. The pupil aberration map represents the saturation values of fluctuations in the optical characteristic generated in a plurality of regions, which are obtained by dividing the pupil plane of the projection optical system 40, upon irradiating these regions with a unit amount of light. In other words, the pupil aberration map is a map, over the entire pupil of the projection optical system 40, of the exposure aberration correction coefficient for each of the optical characteristics (the focus, field curvature, projection magnification, distortion, and wavefront aberration) obtained upon irradiating one point in the pupil plane of the projection optical system 40 with light.

In this embodiment, the control unit 100 executes a process of calculating the exposure aberration correction coefficient based on a light intensity distribution formed on the pupil plane of the projection optical system 40 upon illuminating the pattern of an arbitrary reticle in an arbitrary illumination mode, and a pupil aberration map. In other words, the control unit 100 has an aspect as a calculation unit which calculates the exposure aberration correction coefficient serving as the saturation value of a fluctuation in the optical characteristic generated in the projection optical system 40. The exposure aberrations generated in the projection optical system 40 do not interact with each other in the pupil plane, and have an additivity in which the overall exposure aberration can be represented as a sum of exposure aberrations generated in a plurality of regions obtained by dividing the pupil plane of the projection optical system 40.

Figure 4A:
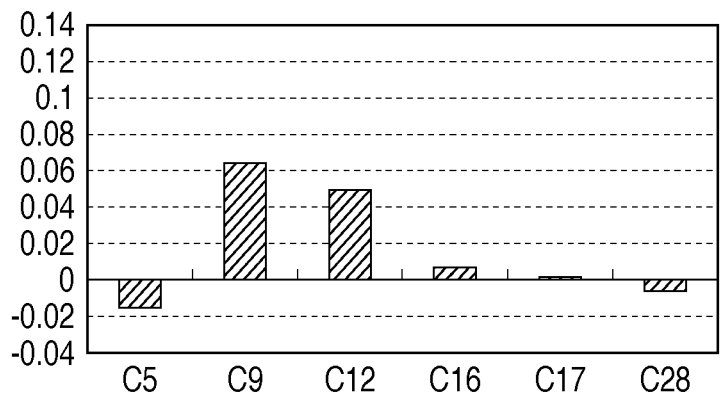
FIGS. 4A to 4C are graphs for explaining the additivity of exposure aberrations generated in the projection optical system of the exposure apparatus shown in FIG. 1.
Figure 4B:
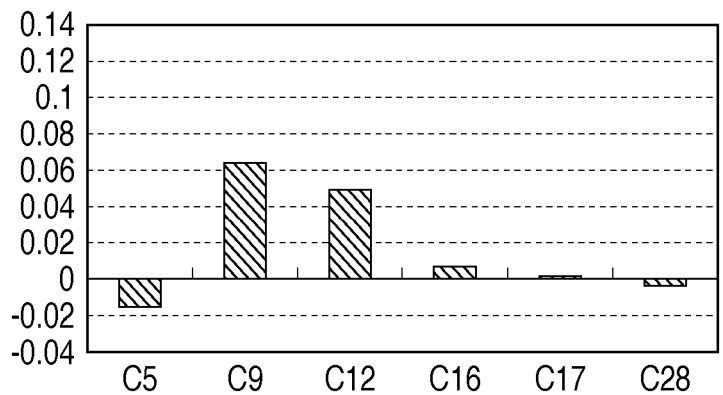
Figure 4C:
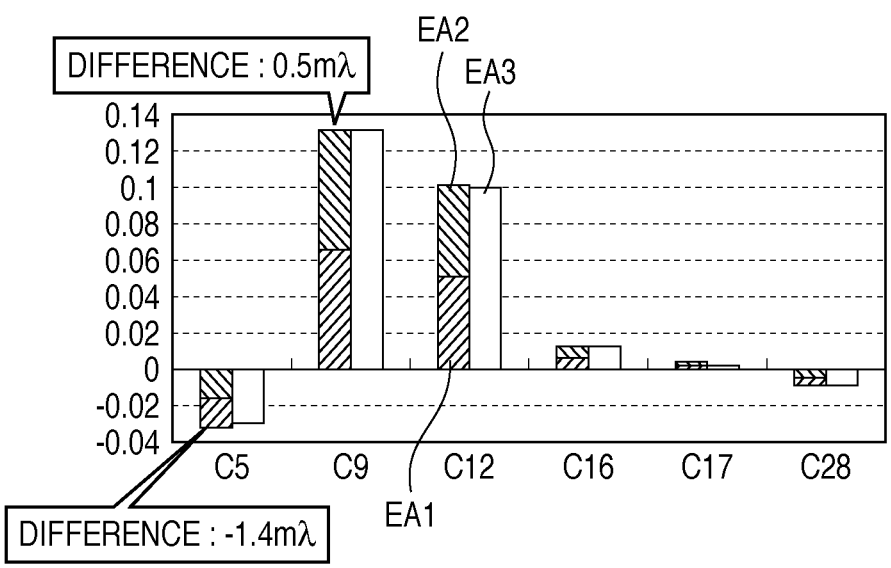

For example, a case in which a dipole light intensity distribution as shown in FIG. 3A is formed on the pupil plane of the projection optical system 40, and is divided into two light intensity distributions as shown in FIGS. 3B and 3C will be considered. When a light intensity distribution shown in FIG. 3B is formed on the pupil plane of the projection optical system 40, an exposure aberration as shown in FIG. 4A is generated in regions including the light intensity distribution in the pupil plane of the projection optical system 40. When a light intensity distribution shown in FIG. 3C is formed on the pupil plane of the projection optical system 40, an exposure aberration as shown in FIG. 4B is generated in regions including the light intensity distribution in the pupil plane of the projection optical system 40. Then, the sum of the exposure aberrations shown in FIGS. 4A and 4B is nearly equal to an exposure aberration generated in the projection optical system 40 when a light intensity distribution shown in FIG. 3A is formed on the pupil plane of the projection optical system 40, as shown in FIG. 4C. Hence, an exposure aberration generated in the projection optical system 40 when a light intensity distribution shown in FIG. 3A is formed on the pupil plane of the projection optical system 40 can be represented by the sum of the exposure aberrations shown in FIGS. 4A and 4B. Note that, in FIG. 4C, the exposure aberration shown in FIG. 4A is indicated by EA1, that shown in FIG. 4B is indicated by EA2, and that generated in the projection optical system 40 when a light intensity distribution shown in FIG. 3A is formed on the pupil plane of the projection optical system 40 is indicated by EA3.

This additivity is also applicable to the exposure aberration correction coefficient. Assume that the pupil plane of the projection optical system 40 is divided into a plurality of regions (e.g., n regions), and exposure aberration correction coefficients generated in the n regions upon irradiating them with a unit amount of light are Ic1, Ic2, Ic3, . . . , Icn. In this case, the overall exposure correction coefficient Ic of the projection optical system 40 can be expressed by Ic1+Ic2+Ic3+ . . . +Icn.

First, inclusion regions including a light intensity distribution formed on the pupil plane of the projection optical system 40 upon illuminating the pattern of an arbitrary reticle in an arbitrary illumination mode are specified from a plurality of regions obtained by dividing the pupil plane of the projection optical system 40. Next, the overall exposure correction coefficient Ic of the projection optical system 40 can be calculated by adding the products of exposure aberration correction coefficients generated in the inclusion regions extracted from a pupil aberration map and the light intensities in the inclusion regions, and dividing the sum by the light intensities in the inclusion regions. More specifically, letting f(x, y) be the pupil aberration map, and g(x, y) be the light intensity distribution formed on the pupil plane of the projection optical system 40, the overall exposure correction coefficient Ic of the projection optical system 40 can be calculated by:

$$Ic = \frac{\sum_{x=-1}^{1} \sum_{y=-1}^{1} f(x, y) * g(x, y)}{\sum_{x=-1}^{1} \sum_{y=-1}^{1} g(x, y)} \quad (4)$$

where x and y represent the x- and y-coordinates in the pupil plane of the projection optical system 40, and are normalized within the range from −1 to 1.

When the pupil aberration map f(x, y) is obtained for each optical characteristic of the projection optical system 40, the exposure aberration correction coefficient for each optical characteristic can be precisely, quickly calculated by obtaining a light intensity distribution formed on the pupil plane of the projection optical system 40. The exposure apparatus 1 can attain excellent exposure performance by calculating the amounts of fluctuations in the optical characteristics, which are generated in the projection optical system 40, using the thus calculated exposure aberration correction coefficients, and adjusting the projection optical system 40 so as to decrease the amounts of fluctuations in the optical characteristics. The projection optical system 40 is adjusted by, for example, controlling by the control unit 100 the drive mechanism 80 (second drive unit 84) to drive the lens 42 of the projection optical system 40 in the direction of the optical axis OA. Accordingly, the drive mechanism 80 and control unit 100 also serve as an adjusting unit which adjusts the projection optical system 40 in this embodiment.

In this manner, the exposure apparatus 1 can attain excellent exposure performance and hence can provide high-quality devices (e.g., a semiconductor device and a liquid crystal display device) with a high throughput and a good economical efficiency. The devices are fabricated by a step of exposing a substrate (e.g., a wafer or a glass plate) coated with a resist (photosensitive agent) using the exposure apparatus 1, a step of developing the exposed substrate, and other known steps.

A method of obtaining a pupil aberration map and a method of obtaining a light intensity distribution formed on the pupil plane of the projection optical system 40 will be explained below.

The method of obtaining a pupil aberration map will be explained first. A pupil aberration map can be obtained by executing the following processes by the control unit 100. Hence, the control unit 100 also has an aspect as a map obtaining unit which obtains a pupil aberration map.

Figure 6A:
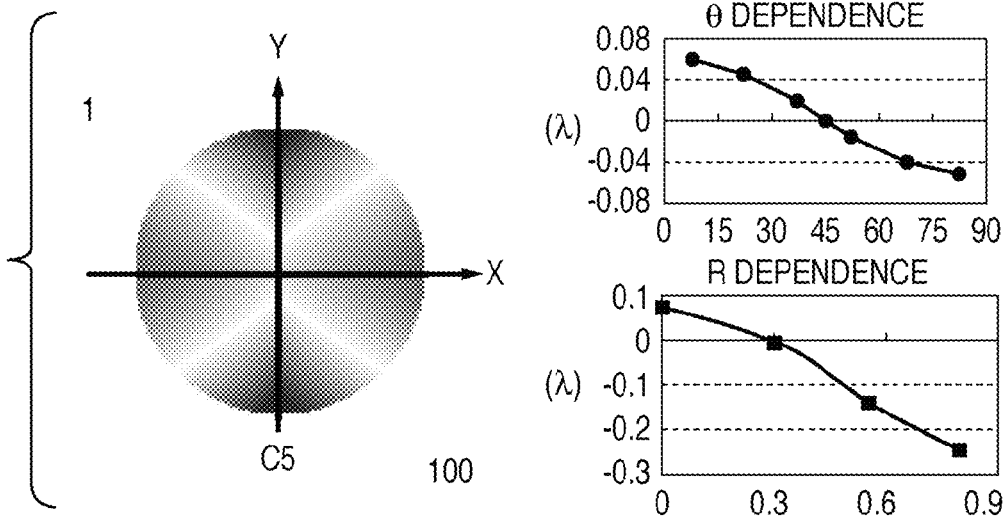
FIGS. 6A to 6C are graphs showing the tendencies, in the angular direction and radial direction, of each aberration in the pupil plane of the projection optical system.
Figure 6B:
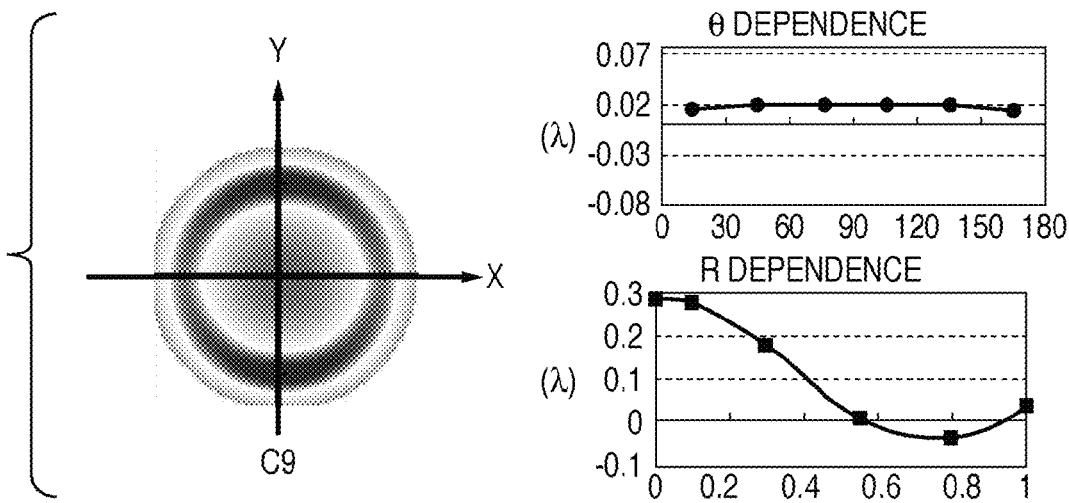
Figure 6C:
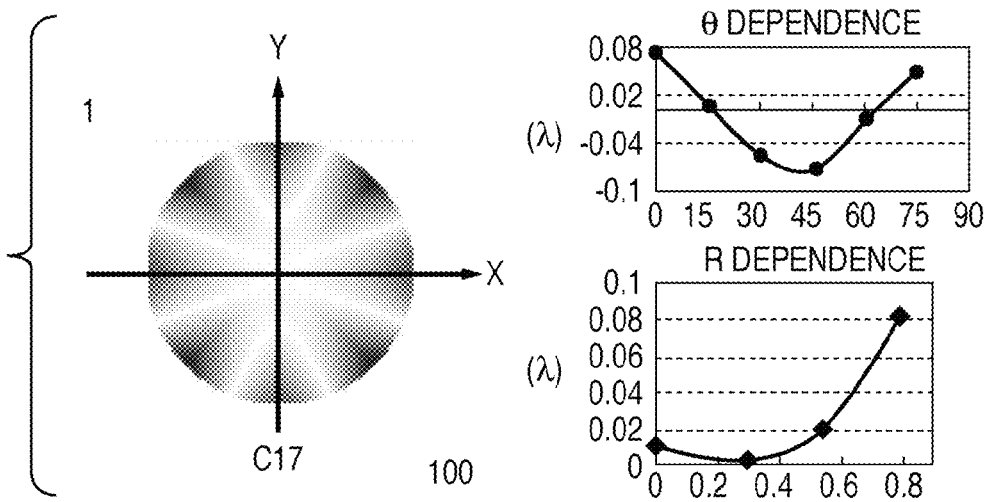

A pupil aberration map is described by a function which uses an angular direction θ and a radial direction R in the pupil plane of the projection optical system 40 as variables, as shown in FIG. 5. FIGS. 6A to 6C are graphs showing the tendencies (the θ dependence and R dependence), in the angular direction θ and radial direction R, of each aberration in the pupil plane of the projection optical system 40. Referring to FIGS. 6A to 6C, each aberration is described by a sine or cosine function in the angular direction θ and has a unique period. Also, each aberration is described by a cubic function having an extreme value at the center in the radial direction R. The aberration over the entire pupil of the projection optical system 40 can be obtained by function fitting by actually measuring the aberrations at three points in the x-axis direction and those at three points in the y-axis direction in the pupil plane of the projection optical system 40. In other words, a pupil aberration map can be obtained by measuring the amounts of fluctuations in aberrations generated in some of a plurality of regions obtained by dividing the pupil plane of the projection optical system 40.

Figures 7, 8:
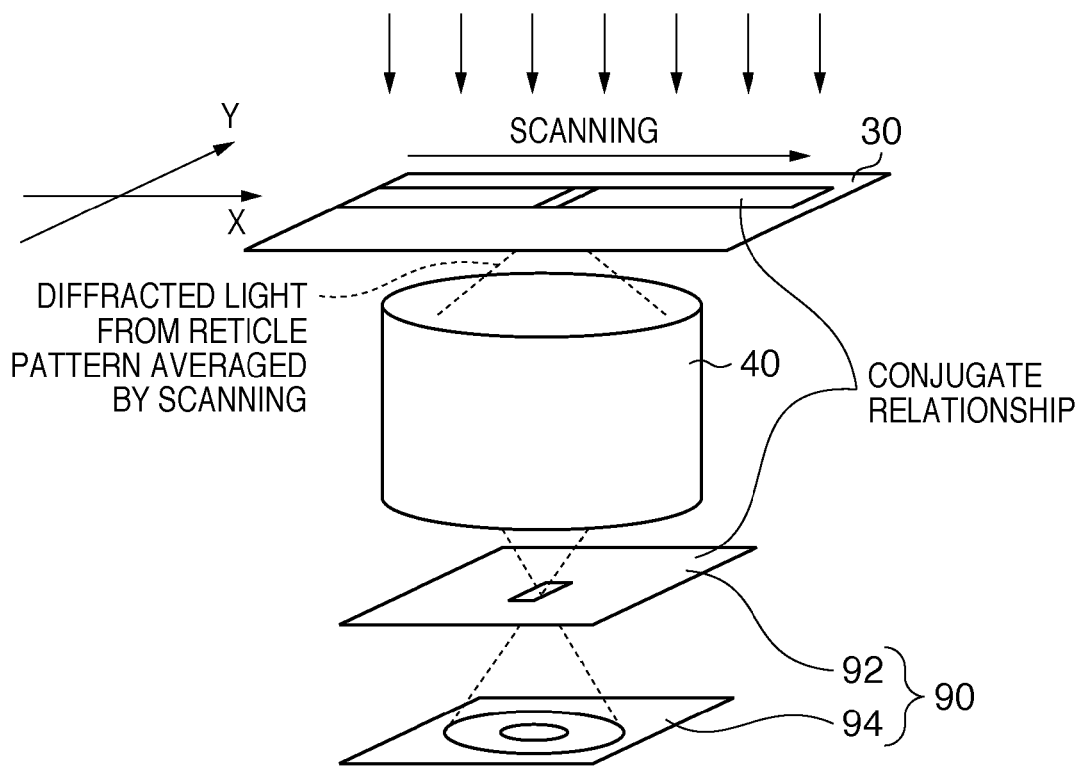
FIG. 7 is a table showing an example of illumination modes used in measuring each aberration in the pupil plane of the projection optical system.
FIG. 8 is a view for explaining a case in which a light intensity distribution formed on the pupil plane of the projection optical system is obtained using a detection unit of the exposure apparatus shown in FIG. 1.

To measure the aberration in the pupil plane of the projection optical system 40, only five illumination modes as shown in FIG. 7, for example, need be used. The five illumination modes are an illumination mode having a pole (radius: 0.1) at the center, two illumination modes having poles (radius: 0.1) at positions 0.6 and 0.8 along the y-axis direction, and two illumination modes having poles (radius: 0.1) at positions 0.6 and 0.8 along the x-axis direction. FIG. 7 is a table showing an example of illumination modes used in measuring each aberration in the pupil plane of the projection optical system 40.

A tendency fx(x) of the exposure aberration correction coefficient in the x-axis direction in the pupil plane of the projection optical system 40 is given by:

$$fx(x)=Ax^3+Bx^2+C \quad (5)$$

A tendency fy(y) of the exposure aberration correction coefficient in the y-axis direction in the pupil plane of the projection optical system 40 is given by:

$$fy(y)=Dy^3+Ey^3+F \quad (6)$$

The exposure aberration correction coefficient for each of the optical characteristics (the focus, field curvature, projection magnification, distortion, and wavefront aberration) of the projection optical system 40 is calculated by thermal analysis simulation based on the illumination modes shown in FIG. 7, and fitting is executed by the functions given by expressions (5) and (6) for each optical characteristic. With this operation, the coefficients A to F in the functions shown in expressions (5) and (6) are calculated. From expressions (5) and (6), a function aberration map F(x, y) is given by:

$$F(x, y) = \left(f_x(R) - \frac{f_x(R) + f_y(R)}{2}\right) * \cos(G * \theta) + \frac{f_x(R) + f_y(R)}{2} \quad (7)$$

or $$F(x, y) = \left(f_x(R) - \frac{f_x(R) + f_y(R)}{2}\right) * \sin(G * \theta) + \frac{f_x(R) + f_y(R)}{2} \quad (8)$$

for $R = \sqrt{x^2 + y^2}$, $\theta = \arctan(y/x)$ where x and y represent the x- and y-coordinates in the pupil plane of the projection optical system 40, and are normalized within the range from −1 to 1; R is the distance from the pupil center of the projection optical system 40 to the coordinate (x, y); and θ is the rotation angle (the counterclockwise direction is the positive direction) from the x-axis in the pupil plane of the projection optical system 40.

Whether expression (7) or (8) is used as the pupil aberration map is determined in accordance with the type of optical characteristic of interest of the projection optical system 40. Likewise, the coefficient G in a sine function or cosine function is determined in accordance with the type of optical characteristic of interest of the projection optical system 40. The coordinates are defined by dividing the pupil plane of the projection optical system 40 into, for example, 256×256 regions, and values corresponding to the coordinates are stored as variables for each optical characteristic of the projection optical system 40 from the calculated function. The above-mentioned function fitting, the number of aberration measurement points, and the type of aberration are merely an example, and are not particularly limited to this example. It is also possible to calculate by thermal analysis simulation all the exposure aberration correction coefficients in a plurality of regions obtained by dividing the pupil plane of the projection optical system 40.

The method of obtaining a light intensity distribution formed on the pupil plane of the projection optical system 40 will be explained next. A light intensity distribution formed on the pupil plane of the projection optical system 40 can be calculated by, for example, the convolution integral between the two-dimensional Fourier transform of the pattern of a reticle used in the exposure apparatus 1 and the illumination mode for illuminating the reticle (i.e., the illumination shape). At this time, the light intensity distribution is calculated as a combination of the light intensities in regions corresponding to a plurality of regions obtained by dividing the pupil plane of the projection optical system 40. Since the control unit 100 executes this calculation process, it also often serves as a distribution obtaining unit which obtains a light intensity distribution formed on the pupil plane of the projection optical system 40 in this embodiment.

A light intensity distribution formed on the pupil plane of the projection optical system 40 can also be detected using the detection unit 90, as shown in FIG. 8. The light-shielding plate 92 is arranged such that the surface of the light-shielding plate 92 is flush with that of the wafer 50, as mentioned above. The photoelectric conversion unit 94 is arranged at a position at which diffracted light from the pattern of the reticle 30 generates a light intensity distribution formed on the pupil plane of the projection optical system 40. The entire light intensity distribution, in the scanning direction, formed on the pupil plane of the projection optical system 40 can be obtained by detecting the light having passed through the pinhole in the light-shielding plate 92 by the photoelectric conversion unit 94 while scanning the reticle 30. The entire light intensity distribution in a direction perpendicular to the scanning direction is obtained in the same way, and these obtained light intensity distributions are integrated. This makes it possible to obtain a light intensity distribution formed on the pupil plane of the projection optical system 40. It is also possible to detect the light having passed through the pinhole in the light-shielding plate 92 by the photoelectric conversion unit 94 while synchronously scanning the reticle 30 and the detection unit 90, thereby obtaining a light intensity distribution formed on the pupil plane of the projection optical system 40 from the sum of the light amounts on the elements of the photoelectric conversion unit 94. FIG. 8 is a view for explaining a case in which a light intensity distribution formed on the pupil plane of the projection optical system 40 is obtained using the detection unit 90.

A light intensity distribution formed on the pupil plane of the projection optical system 40 needs to be obtained again every time the illumination mode and the reticle (pattern) are changed. In contrast, a pupil aberration map need not be obtained again once it is obtained, irrespective of changes in the illumination mode and the reticle (pattern).

Although this embodiment has exemplified a case in which the pupil aberration map of each optical characteristic of the projection optical system 40 is obtained by the exposure apparatus 1, it may be obtained in advance and stored in, for example, a memory of the control unit 100.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2008-060075 filed on Mar. 10, 2008, which is hereby incorporated by reference herein in its entirety.

What is claimed is:

1. An exposure apparatus comprising:
a projection optical system configured to project a pattern of a reticle onto a substrate;
a map obtaining unit configured to obtain a pupil aberration map representing saturation values of fluctuations in an optical characteristic generated in a plurality of regions on a pupil plane of the projection optical system, upon irradiating each of the plurality of regions with a unit amount of light, wherein the saturation value is obtained for each of the plurality of regions;
a distribution obtaining unit configured to obtain a light intensity distribution formed on the plurality of regions on the pupil plane of the projection optical system upon illuminating a pattern of an arbitrary reticle in an arbitrary illumination mode;
a calculation unit configured to calculate a saturation value of a fluctuation in the optical characteristic generated in the projection optical system upon illuminating the pattern of the arbitrary reticle in the arbitrary illumination mode, by obtaining, a product of a light intensity in each region on the obtained light intensity distribution and the saturation value in each region on the pupil aberration map and by using a value obtained by adding each of obtained products; and
an adjusting unit configured to adjust the projection optical system so as to decrease an amount of the fluctuation in the optical characteristic of the projection optical system, which is calculated from the saturation value of the fluctuation in the optical characteristic generated in the projection optical system, which is calculated by said calculation unit.

2. The apparatus according to claim 1, wherein said calculation unit calculates a saturation value of a fluctuation in the optical characteristic generated in the projection optical system by specifying inclusion regions including the light intensity distribution obtained by said distribution obtaining unit from the plurality of regions, adding products of saturation values of the optical characteristic generated in the inclusion regions extracted from the pupil aberration map and light intensities in the inclusion regions, and dividing the sum by the light intensities in the inclusion regions.

3. The apparatus according to claim 1, wherein said distribution obtaining unit includes a detection unit which is arranged on a side of an image plane of the projection optical system, and which includes a light-shielding plate in which a pinhole configured to pass the light from the projection optical system is formed, and a photoelectric conversion unit configured to detect the light having passed through the pinhole.

4. The apparatus according to claim 3, wherein said distribution obtaining unit detects the light having passed through said pinhole by said photoelectric conversion unit while scanning the arbitrary reticle, thereby obtaining an entire light intensity distribution, in a scanning direction, formed on the pupil plane of the projection optical system.

5. The apparatus according to claim 1, wherein said distribution obtaining unit calculates a light intensity distribution formed on the pupil plane of the projection optical system, based on the pattern of the arbitrary reticle and the arbitrary illumination mode.

6. The apparatus according to claim 1, wherein said map obtaining unit obtains the pupil aberration map by measuring amounts of fluctuations in the optical characteristic generated in some of a plurality of regions obtained by dividing the pupil plane of the projection optical system.

7. The apparatus according to claim 1, wherein said map obtaining unit calculates the pupil aberration map by thermal analysis simulation.

8. The apparatus according to claim 1 wherein said map obtaining unit obtains, as the pupil aberration map, a function which uses an angular direction and a radial direction in the pupil plane of the projection optical system as variables.

9. The apparatus according to claim 1, wherein the optical characteristic include at least one of a focus, a field curvature, a projection magnification, a distortion, and a wavefront aberration.

10. An exposure method using an exposure apparatus including a projection optical system which projects a pattern of a reticle onto a substrate, the method comprising:
   a map obtaining step of obtaining a pupil aberration map representing saturation values of fluctuations in an optical characteristic generated in a plurality of regions on a pupil plane of the projection optical system, upon irradiating each of the plurality of regions with a unit amount of light, wherein the saturation value is obtained for each of the plurality of regions;
   a distribution obtaining step of obtaining a light intensity distribution formed on the plurality of regions on the pupil plane of the projection optical system upon illuminating a pattern of an arbitrary reticle in an arbitrary illumination mode;
   a calculation step of calculating a saturation value of a fluctuation in the optical characteristic generated in the projection optical system upon illuminating the pattern of the arbitrary reticle in the arbitrary illumination mode by obtaining a product of a light intensity in each region on the obtained light intensity distribution and the saturation value in each region on the pupil aberration map and by using a value obtained by adding each of obtained products;
   an adjusting step of adjusting the projection optical system so as to decrease an amount of the fluctuation in the optical characteristic of the projection optical system, which is calculated from the saturation value of the fluctuation in each of the optical characteristic generated in the projection optical system, which is calculated in the calculation step; and
   a projection step of projecting the pattern of the arbitrary reticle onto a substrate via the projection optical system adjusted in the adjusting step.

11. A method of calculating saturation values of fluctuations in optical characteristics generated in a projection optical system which projects a pattern of a reticle onto a substrate, the method comprising:
   a map obtaining step of obtaining a pupil aberration map representing saturation values of fluctuations in an optical characteristic generated in a plurality of regions on a pupil plane of the projection optical system, upon irradiating each of the plurality of regions with a unit amount of light, wherein the saturation value is obtained for each of the plurality of regions;
   a distribution obtaining step of obtaining a light intensity distribution formed on the plurality of regions on the pupil plane of the projection optical system upon illuminating a pattern of an arbitrary reticle in an arbitrary illumination mode; and
   a calculation step of calculating a saturation value of a fluctuation in the optical characteristic generated in the projection optical system upon illuminating the pattern of the arbitrary reticle in the arbitrary illumination mode, by obtaining a product of a the light intensity in each region on the obtained light intensity distribution and the saturation value in each region on the pupil aberration map and by using a value obtained by adding each of obtained products.

12. A device fabrication method comprising steps of:
exposing a substrate using an exposure apparatus; and
performing a development process for the substrate exposed,
wherein said exposure apparatus includes:
   a projection optical system configure to project a pattern of a reticle onto the substrate;
   a map obtaining unit configured to obtain a pupil aberration map representing saturation values of fluctuations in an optical characteristic generated in a plurality of regions on a pupil plane of the projection optical system, upon irradiating each of the plurality of regions with a unit amount of light, wherein the saturation value is obtained for each of the plurality of regions;
   a distribution obtaining unit configured to obtain a light intensity distribution formed on the plurality of regions on the pupil plane of the projection optical system upon illuminating a pattern of an arbitrary reticle in an arbitrary illumination mode;
   a calculation unit configured to calculate a saturation value of a fluctuation in the optical characteristic generated in the projection optical system upon illuminating the pattern of the arbitrary reticle in the arbitrary illumination mode, by obtaining a product of a light intensity and in each region on the obtained light intensity distribution the saturation value in each region on the pupil aberration map and by using a value obtained by adding each of obtained products; and
   an adjusting unit configured to adjust the projection optical system so as to decrease an amount of the fluctuation in the optical characteristic of the projection optical system, which is calculated from the saturation value of the fluctuation in the optical characteristic generated in the projection optical system, which is calculated by said calculation unit.

* * * * *